(12) United States Patent
Chang et al.

(10) Patent No.: US 10,409,118 B1
(45) Date of Patent: Sep. 10, 2019

(54) PIXEL ARRAY ANTIALIASING TO ACCOMMODATE CURVED DISPLAY EDGES

(71) Applicant: Apple Inc., Cupertino, CA (US)

(72) Inventors: Pei-En Chang, Campbell, CA (US); Szu-Hsien Lee, Cupertino, CA (US); Hsin-Ying Chiu, San Jose, CA (US); Chun-Yao Huang, Cupertino, CA (US); Kyung Wook Kim, Cupertino, CA (US); Shih Chang Chang, Cupertino, CA (US); Hossein Nemati, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/498,356

(22) Filed: Apr. 26, 2017

Related U.S. Application Data

(60) Provisional application No. 62/423,640, filed on Nov. 17, 2016.

(51) Int. Cl.
*G02F 1/1343* (2006.01)
*G02F 1/1335* (2006.01)
(Continued)

(52) U.S. Cl.
CPC .... *G02F 1/134309* (2013.01); *G02F 1/13439* (2013.01); *G02F 1/133308* (2013.01);
(Continued)

(58) Field of Classification Search
CPC ......... G02F 1/133512; G02F 1/133514; G02F 1/1343; G02F 1/134309; G02F 1/134363; G02F 1/1335; G02F 1/133707; G02F 1/136286; G02F 1/136213; G02F 1/1333; G02F 1/133308; G02F 1/136227; G02F 2001/133388; G02F 2001/134345; G02F 2001/133331; G02F 2001/134372;
(Continued)

(56) References Cited

U.S. PATENT DOCUMENTS 7,404,645 B2   7/2008   Margulis
8,451,414 B2*  5/2013   Nonaka ............. G02F 1/133514
                                                              349/146

(Continued)

*Primary Examiner* — Thoi V Duong
(74) *Attorney, Agent, or Firm* — Treyz Law Group, P.C.; G. Victor Treyz; Joseph F. Guihan

(57) ABSTRACT

An electronic device may have a housing and a display in the housing. The display may have one or more curved edges such as curved edges associated with rounded corners in the display and housing. The display may have an array of pixels. The display may include full-strength pixels and may have a band of antialiasing pixels having selectively reduced strengths to visually smooth content displayed along the curved edges. The pixels may be organic light-emitting diode pixels, liquid crystal display pixels, or other display pixels. Organic light-emitting diode pixels may have drive transistors and associated organic light-emitting diodes. Selectively elevated series or opaque light blocking structures of selectively reduced areas may be used to selectively reduce the strength of the antialiasing pixels. Liquid crystal display pixels may include electrodes of different shapes and/or opaque layer openings of different sizes to form antialiasing pixels in desired patterns.

9 Claims, 9 Drawing Sheets

(51) Int. Cl.
*G02F 1/1333* (2006.01)
*H01L 27/32* (2006.01)
*G02F 1/133* (2006.01)

(52) U.S. Cl.
CPC .. *G02F 1/133512* (2013.01); *G02F 1/133514* (2013.01); *H01L 27/3262* (2013.01); *G02F 1/13306* (2013.01); *G02F 2201/56* (2013.01)

(58) Field of Classification Search
CPC ............. G02F 2201/56; G02F 2201/52; G02F 2201/123; G02F 2201/122; G02F 2201/40; G02F 1/13439; G02F 1/13306; G09G 2300/0426; G09G 2300/0452; G09G 2300/04; G09G 2300/0447; G09G 2320/0276; G09G 2320/0626; G09G 2320/0233; G09G 3/18; G09G 3/2003; H04N 9/3182; H01L 27/3262
See application file for complete search history.

(56) References Cited

U.S. PATENT DOCUMENTS

| | | |
|---|---|---|
| 8,576,209 B2 | 10/2013 | Miyaguchi |
| 9,417,488 B2 | 8/2016 | Kim et al. |
| 9,634,040 B2 | 4/2017 | Guo et al. |
| 2010/0214195 A1* | 8/2010 | Ogasawara ....... G02F 1/136286 345/55 |
| 2015/0211707 A1* | 7/2015 | Watanabe ......... G02F 1/133308 345/667 |
| 2016/0026050 A1 | 1/2016 | Lin et al. |
| 2017/0322446 A1* | 11/2017 | Tae .................. G02F 1/133345 |
| 2018/0246363 A1* | 8/2018 | Nemati ............... G02F 1/13454 |

\* cited by examiner

PIXEL ARRAY ANTIALIASING TO ACCOMMODATE CURVED DISPLAY EDGES

This application claims the benefit of provisional patent application No. 62/423,640, filed Nov. 17, 2016, which is hereby incorporated by reference herein in its entirety.

BACKGROUND

This relates generally to electronic devices and, more particularly, to electronic devices with displays.

Electronic devices often include displays. Displays may include arrays of pixels for displaying images for a user. An inactive border region may run along the edge of an array of pixels.

If care is not taken, electronic device displays may have borders and other regions with undesirable appearances.

SUMMARY

An electronic device may have a housing. A display may be supported by the housing. The display may have one or more curved edges. For example, the display may have curved edges associated with rounded corners in the housing. The display may have an array of pixels with jagged edges along the curved edges.

The display may include full-strength pixels and may have a band of antialiasing pixels having selectively reduced strengths relative to the full-strength pixels. The antialiasing pixels may be provided with a pattern of strengths that visually smooth content displayed along the curved edges.

The pixels may be organic light-emitting diode pixels, liquid crystal display pixels, or other display pixels. Organic light-emitting diode pixels may have drive transistors and associated organic light-emitting diodes. The strength of the antialiasing pixels may be selectively reduced by modifying drive transistor geometry, adding series resistances, or by forming opaque light blocking structures that selectively limit the amount of light emitted by the organic light-emitting diodes. Liquid crystal display pixels may include electrodes of different shapes and/or opaque layer openings of different sizes to form antialiasing pixels with reduced strengths.

DETAILED DESCRIPTION

Figure 1:
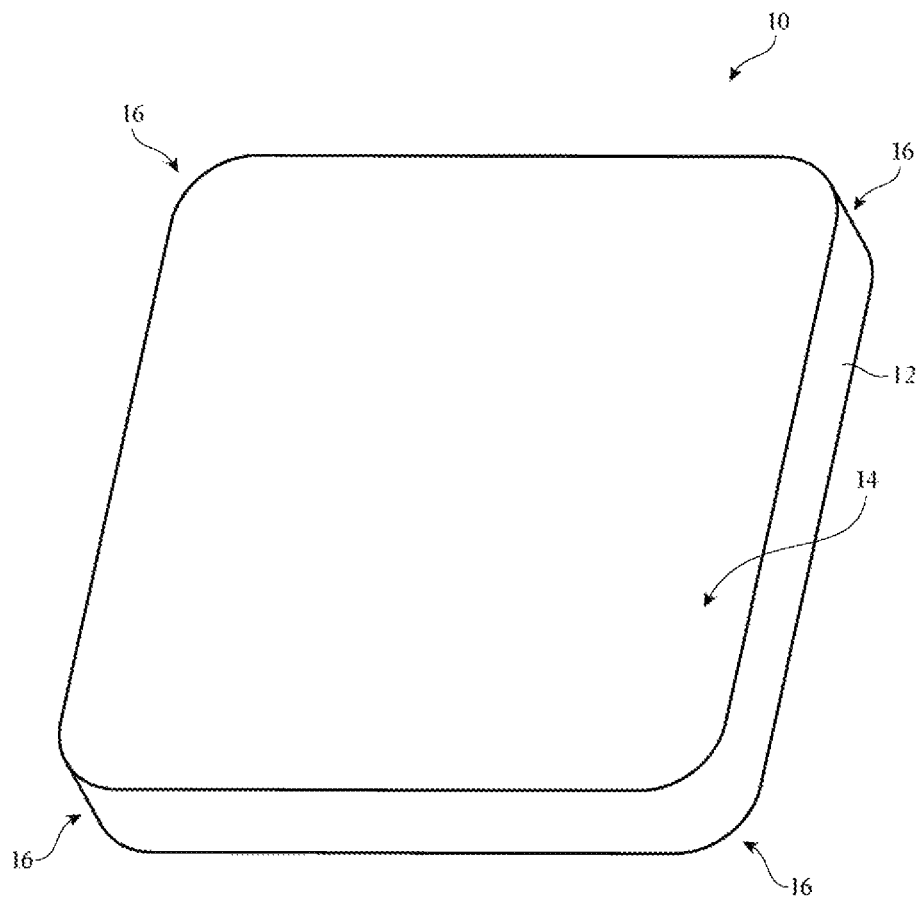
FIG. 1 is a perspective view of an illustrative electronic device in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

In the illustrative configuration of FIG. 1, device 10 is a portable device such as a cellular telephone, media player, tablet computer, electronic book, watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may be used to support display 14 in an upright position (e.g., for a desktop display or wall-mounted display), may be used to support display 14 on a laptop computer unit, or may otherwise be used in supporting display 14.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include pixels formed from liquid crystal display (LCD) components, electrophoretic pixels, micro-electromechanical (MEMs) shutter pixels, electrowetting pixels, micro-light-emitting diodes (small crystalline semiconductor die), organic light-emitting diodes (e.g., a thin-film organic light-emitting diodes), or pixels based on other display technologies. The pixels of display 14 may be arranged in rows and columns for form an array of pixels. The array of pixels serves as an active area in which images are displayed for a user. If desired, inactive border regions may run along one or more of the edges of the active area of display 14.

Display 14 and the array of pixels in display 14 may have curved edges. The curved edges may be associated with openings in display 14 (e.g., an oval opening surrounding a speaker port in display 14) or may be associated with an outer peripheral edge of display 14 (e.g., the periphery of display 14 of FIG. 1). As shown in the example of FIG. 1, housing 12 and display 14 may have two or more corners 16 (e.g., four corners for a rectangular display arrangement). The edges of housing 12 and display 14 at corners 16 may be curved.

Particularly in configurations in which inactive border portions of display 14 are narrow, the curved shape of the periphery of display 14 and/or openings or other portions of display 14 may lead to scenarios in which pixels along the edge of the active region have a jagged layout. If care is not taken, the jagged layout of the pixels along a curved edge in display 14 may lead to undesired jagged edges in displayed images. With one illustrative configuration, hardware-based antialiasing techniques may be used to smooth the appearance of images along the curved edges of display 14. In particular, the strengths of pixels along the curved edges may be arranged in an antialiasing pattern that visually smoothes content that is displayed on the display along the curved edge and reduces undesired jagged image artifacts.

Figure 2:
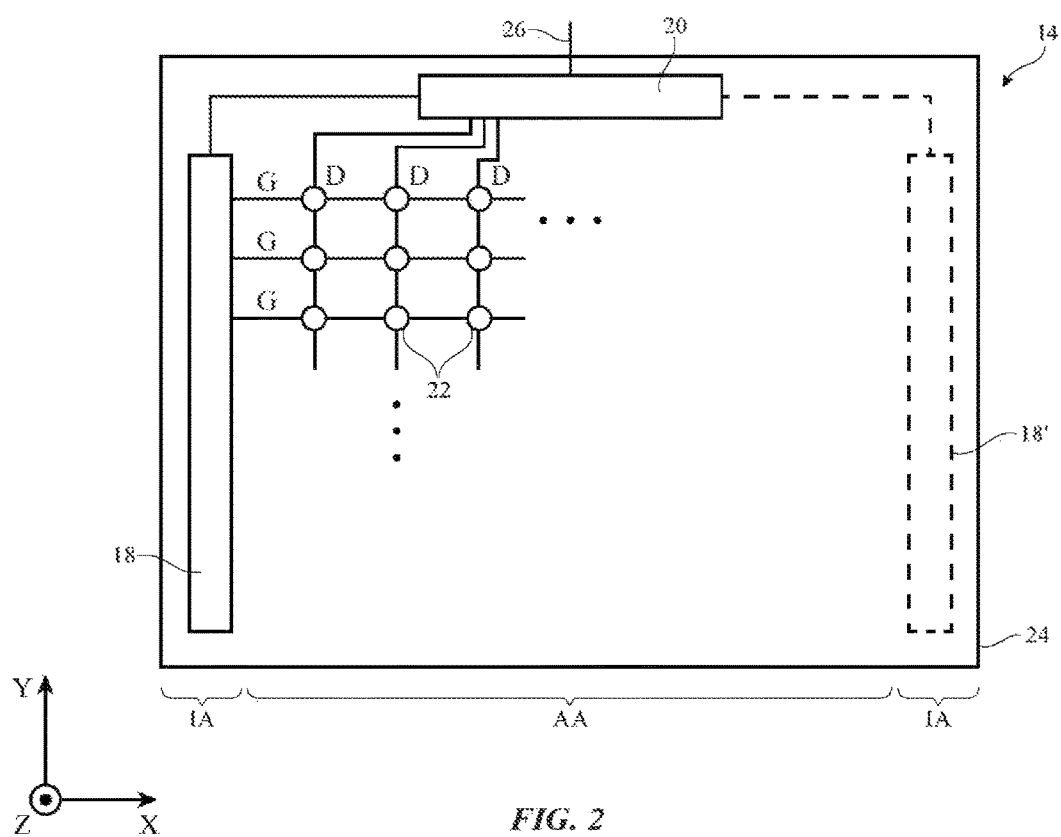
FIG. 2 is a diagram of an illustrative display in accordance with an embodiment.

FIG. 2 is a diagram of an illustrative pixel array for display 14. As shown in FIG. 2, display 14 may include layers such as substrate layer 24. Substrate 24 and, if desired, other layers in display 14, may be formed from layers of material such as glass layers, polymer layers (e.g., flexible sheets of polyimide or other flexible polymers), etc. Substrate 24 may be planar and/or may have one or more curved portions (e.g., portions that are bent out of the X-Y plane). Substrate 24 may have a rectangular shape with left and right vertical edges and upper and lower horizontal edges or may have a non-rectangular shape. In configurations in which substrate 24 has a rectangular shape with four corners, the corners may, if desired, be rounded as shown by rounded corners 16 in FIG. 1.

Display 14 may have an array of pixels 22. Pixels 22 form an active area AA of display 14 that displays images for a user. Inactive border portions of display 14 such as inactive areas IA along one or more of the edges of substrate 24 do not contain pixels 22 and do not display images for the user (i.e., inactive area IA is free of pixels 22). Pixels 22 may include pixels of different colors (e.g., red, green, blue, etc.) so that display 14 may display color images.

Display driver circuitry 20 for display 14 may be mounted on substrate 24 or on a separate substrate that is coupled to substrate 24. Signal paths such as signal path 26 may couple display driver circuitry 20 to a graphics processing unit and/or other control circuitry in device 10.

Circuitry 20 may include one or more display driver integrated circuits and/or thin-film transistor circuitry. During operation, the control circuitry of device 10 may supply circuitry such as display driver circuitry 20 with information on images to be displayed on display 14. To display the images on display pixels 22, display driver circuitry 20 may supply corresponding image data to data lines D while issuing clock signals and other control signals to supporting display driver circuitry such as gate driver circuitry 18.

Gate driver circuitry 18 may produce gate line signals (sometimes referred to as scan signals, emission enable signals, etc.) or other control signals for pixels 22. The gate line signals may be conveyed to pixels 22 using lines such as gate lines G. Gate driver circuitry 18 may include integrated circuits and/or thin-film transistor circuitry and may be located along the edges of display 14 (e.g., along the left and/or right edges of display 14 as shown by illustrative gate driver circuitry 18' of FIG. 2) or elsewhere in display 14 (e.g., as part of circuitry 20, along the upper or lower edge of display 14, etc.). The configuration of FIG. 2 is merely illustrative.

Display driver circuitry 20 may supply data signals onto a plurality of corresponding data lines D. With the illustrative arrangement of FIG. 2, data lines D run vertically through display 14 and gate lines G run horizontally. Data lines D are associated with respective columns of pixels 22. Gate lines G (sometimes referred to as scan lines, emission lines, etc.) are each is associated with a respective row of display pixels 22. If desired, there may be multiple horizontal control lines such as gate lines G associated with each row of pixels 22.

Gate driver circuitry 18 may assert gate line signals on the gate lines G in display 14. For example, gate driver circuitry 18 may receive clock signals and other control signals from display driver circuitry 20 and may, in response to the received signals, assert a gate signal on gate lines G in sequence, starting with the gate line signal G in the first row of display pixels 22. As each gate line is asserted, data from data lines D is loaded into the corresponding row of display pixels. In this way, control circuitry in device 10 can direct display 14 to display frames of image data for a user.

The circuitry of pixels 22 and, if desired, display driver circuitry such as circuitry 18 and/or 20 may be formed using thin-film transistor circuitry. Thin-film transistors in display 14 may, in general, be formed using any suitable type of thin-film transistor technology (e.g., silicon transistors such as polysilicon thin-film transistors, semiconducting-oxide transistors such as indium gallium zinc oxide transistors, etc.).

Figure 3:
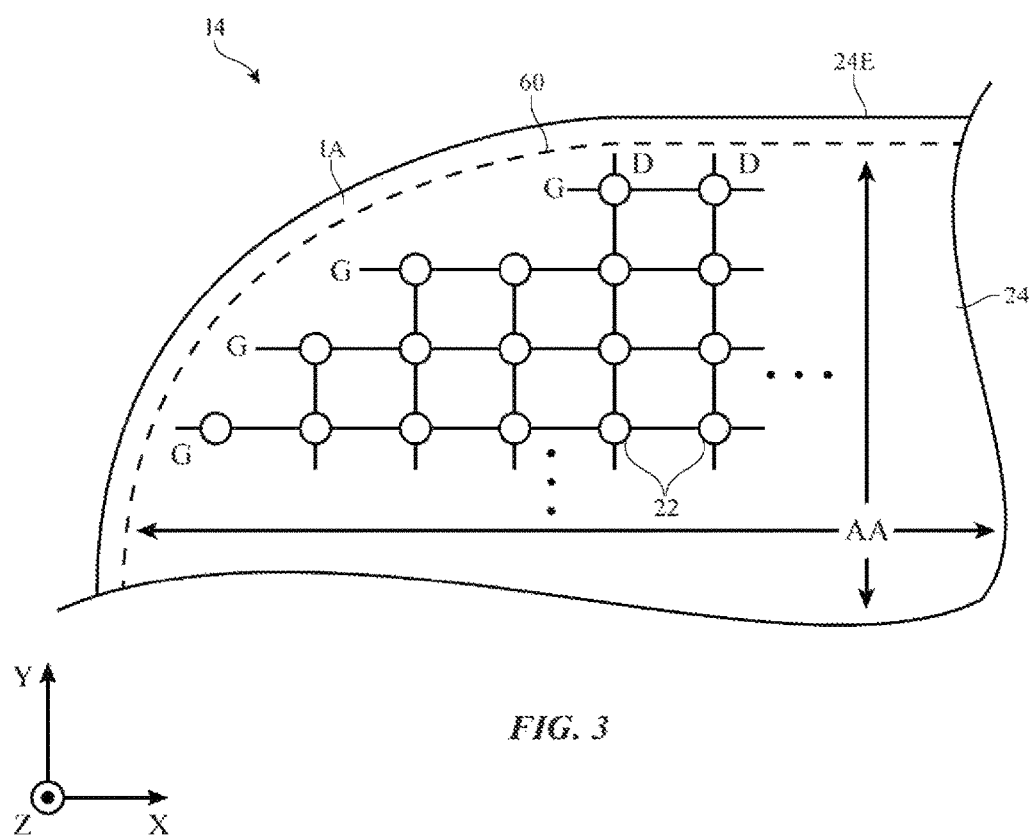
FIG. 3 is a diagram of an illustrative curved edge of a pixel array in a display in accordance with an embodiment.

FIG. 3 is a top view of an illustrative portion of a display with a curved edge. As shown in FIG. 3, the array of pixels 22 in the pixel array in active area AA of display 14 may have a jagged appearance, due to the curved shape of edge (border) 60 between active area AA and inactive area IA. Substrate 24 may have a curved edge 24E that runs parallel to curved edge 60 (e.g., to allow substrate 24 to be mounted within a housing with curved edges such as housing 12 of FIG. 1).

The jagged appearance of pixels 22 may give rise to a risk that images displayed in active area AA will have an undesirable jagged appearance along the curved display edge. To visually smooth out the appearance of content displayed on display 14 along the curved edge of display 14, the pixels 22 that run along curved edge regions in display 14 may be provided with varying strengths. The strengths of pixels 22 may be configured to implement an antialiasing scheme that can visually smooth images displayed on display 14 at the curved edges of display 14, without needing to modify the pixel data being loaded into display 14. Incorporating pixels 22 into display 14 with variable pixel strengths to implement antialiasing may sometimes be referred to as hardware antialiasing. If desired, pixel data may be antialiased using image data processing techniques while simultaneously using hardware antialiasing to further improve image quality. Configurations in which display 14 includes hardware antialiasing and in which image data is not antialiased to accommodate the curved edges in display 14 may sometimes be described herein as an example.

Figure 4:
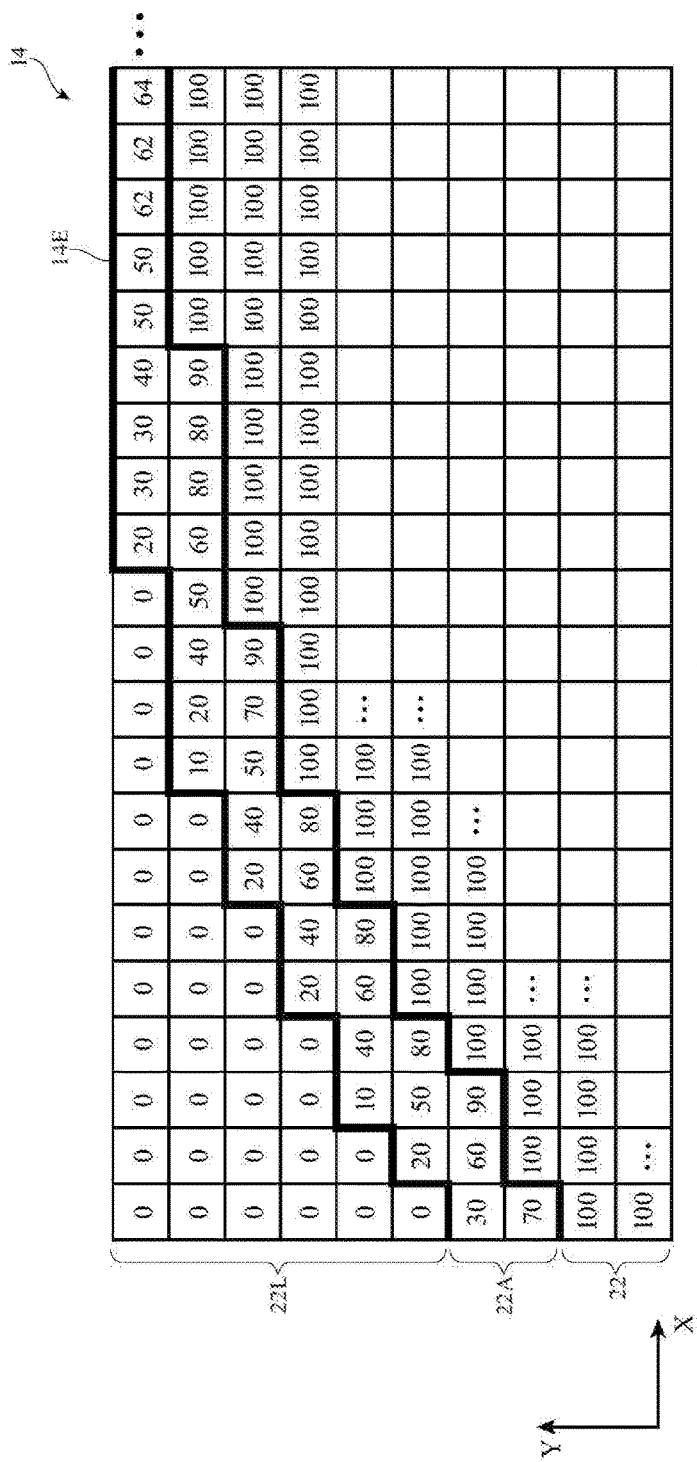
FIG. 4 is an illustrative pixel array in which a band of antialiasing pixels have been provided with a pattern of strengths to visually smooth content displayed along a curved edge of a pixel array in accordance with an embodiment.

Pixel strengths can be varied as a function of pixel location to implement hardware antialiasing using any suitable antialiasing pattern. An illustrative antialiasing pattern is shown in FIG. 4. In the example of FIG. 4, pixels 22 are arranged in an array with a curved edge. Pixels 22 that are labeled "100" are full-strength pixels (e.g., pixels that have a normal design and emit 100% of their light as expected). Pixel locations 22L that are labeled with "0" represent blank pixel locations in which image light is not emitted by display 14. These blank pixel locations along the border of the pixel array may be free of any pixel structures (pixels may be omitted at these locations) or may contain dummy pixel structures or unused pixel structures that do not emit light.

The pixels 22A that lie between the blank border pixel locations "0" and active full strength pixels "100" may have a pattern of reduced pixel strengths (e.g., pixel strengths of less than 100% such as pixel strengths of 10%, 20%, 30%, etc.). These reduced-strength pixels 22A (sometimes referred to as antialiasing pixels) may have any suitable numbers of different strengths. As an example, a band of antialiasing pixels 22A in display 14 may include pixels of 1-100 different strengths, 2-10 different strengths, more than 50 different strengths, etc.). The pattern of pixel strengths associated with pixels 22A may be selected to visually minimize the jagged appearance of the pixels along the curved edge of display 14.

During operation of display 14, no image light passes through the blank pixel locations 22L, so this portion of display 14 may be overlapped by an opaque masking region on a display cover layer, may be covered with a plastic, glass, or metal bezel, may be mounted under an opaque lip associated with housing 12, may be omitted (e.g., so that the curved edge 24E of substrate 24 may fit within a housing with a matching curved sidewall or other matching curved housing 12, etc.), etc.

Figure 5:
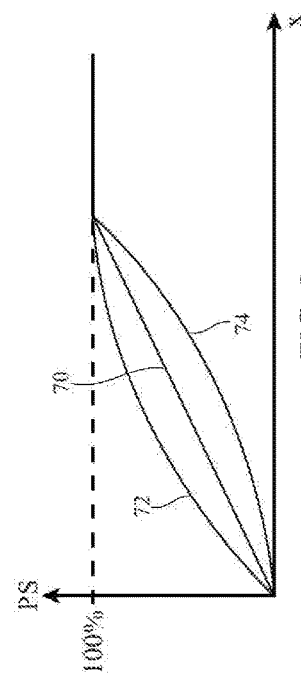
FIG. 5 is a graph showing how pixel strength may vary as a function of position within a strip of pixels extending along an edge of a display in accordance with an embodiment.

In the example of FIG. 4, pixels 22A form a band that is 2-3 pixels in height (parallel to the Y axis) and 3-8 pixels in width (parallel to the X axis). In general, the band of pixels 22A that runs along the edge of the full-strength pixels 22 of display 14 may have any suitable thickness (1 pixel, 2-10 pixels, more than 2 pixels, etc.). Along uppermost edge 14E of display 14, it may be desirable to provide display 14 with an elongated strip of pixels 22A. This may help smooth out the visual appearance of the jagged edge of display 14 in the corner of display 14. As shown in FIG. 5, the strip of pixels 22A running parallel to dimension X along edge 14E of display 14 of FIG. 4 may have a strength that varies linearly as a function of dimension X (see, e.g., line 70 of FIG. 5), that varies in accordance with the square root of X (see, e.g., line 72 of FIG. 5), as a function of the power of 2 or other suitable exponent (see, e.g., line 72 of FIG. 5), or in accordance with other suitable smoothly varying functions.

Hardware antialiasing schemes may be implemented by selectively decreasing the strength (maximum brightness) of antialiasing pixels 22A by varying degrees relative to full-strength pixels 22 in display 14. Each antialiasing pixel 22A may be provided with a fixed decreased strength. Within the band of pixels 22A that run along the edge of display 14, pixel strength may be determined using an antialiasing pattern that helps minimize visual jagged edges to a viewer of display 14. Pixel strength may be reduced by selectively reducing the pixel aperture (opening size) associated with each pixel 22A by an appropriate amount, by individually adjusting the size and shape of components that emit light and/or modulate light for each pixel 22A, and/or by adjusting the series resistance, drive transistor strength or other circuit characteristics in the pixel drive circuit associated with each pixel 22A.

Figure 6:
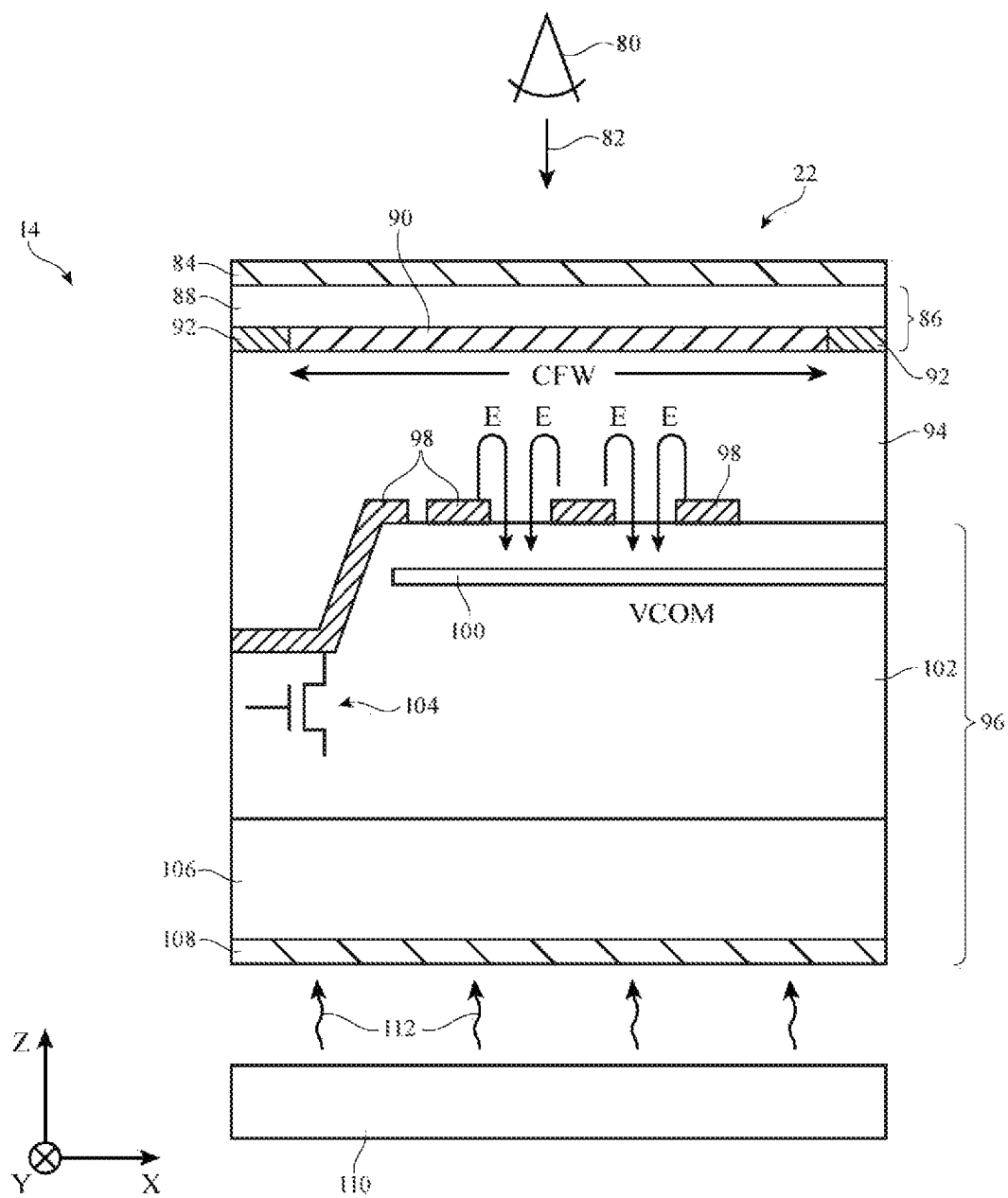
FIG. 6 is a cross-sectional side view of an illustrative liquid crystal display in accordance with an embodiment.

Consider, as an example, a liquid crystal display. A cross-sectional side view of display 14 in a configuration in which display 14 is a liquid crystal display is shown in FIG. 6. As shown in FIG. 6, display 14 may have opposing upper and lower polarizers such as upper polarizer 84 and lower polarizer 108. Backlight unit 110 may supply backlight illumination 112 to an array of pixels 22 formed in display 14. Color filter layer 86 and thin-film transistor layer 96 may be interposed between upper polarizer 84 and lower polarizer 106. Liquid crystal layer 94 may be interposed between color filter layer 86 and thin-film transistor layer 96.

Color filter layer 86 may have a transparent substrate such as substrate 88. Substrate 88 may be formed from glass, plastic, or other transparent material. An array of color filter elements (e.g., red, green, and blue color filter elements) such as color filter element 90 may be formed on the inner surface of color filter layer substrate 88. Each color filter element 90 may be aligned with a respective pixel 22 to provide the backlight illumination 112 for that pixel with a desired color. Color filter elements 90 may be formed within openings of lateral dimension CFW in a grid of opaque masking material (black masking material) 92. The shapes of the openings in opaque layer 92 define the corresponding areas associated with color filter elements 90 and the amount of light 112 that passes through each pixel 22.

Thin-film transistor layer 96 may have a substrate such as substrate 106. Substrate 106 may be a transparent layer formed from glass, plastic, or other clear material. Thin-film circuitry 102 may be formed on substrate 106 and may include thin-film transistors such as thin-film transistor 104. Circuitry 102 (which may sometimes be referred to as thin-film transistor circuitry) may include layers of dielectric (oxides, nitrides, organic layers, etc.), semiconductors, and metals. Electrodes 98 and 100 may be formed in circuitry 102 and may be used to impart a controllable electric field E to liquid crystal layer 94. Electrodes 98, which may sometimes be referred to as electrode fingers, may have elongated shapes that extend into the page of FIG. 6 (e.g., along the Y dimension in the FIG. 6 example). Vcom electrode 100 (sometimes referred to as a common voltage electrode) may be a blanket film that covers display 14 (as an example). Electrodes 98 and 100 may be formed from transparent materials (e.g. thin metals, transparent conductive materials such as indium tin oxide, etc.).

With one illustrative arrangement, strength of the pixels in display 14 may be adjusted by selectively reducing the magnitude of lateral opening dimensions such as dimension CFW associated with the pixel openings in opaque masking layer 92. Opening dimension CFW is set to a maximum permissible size for full-strength pixels 22 (e.g., a maximum size allowed by the fabrication design rules for display 14). Selectively smaller opening dimensions CFW (e.g., 50% of CFW) may be provided for reduced-strength antialiasing pixels. For example, if it is desired to provide an antialiasing pixel 22A with a strength of 10% of a full-strength pixel, the size of the opening in layer 92 that is filled with color filter element material 90 (e.g., red photoresist or other colored material) may be 10% of the size of the opening in layer 92 that is associated with the full-strength pixel. Opening dimensions may be reduced along X and/or Y axes or the footprint of the color filter element openings may otherwise be changed in shape to adjust pixel strength.

Figure 7:
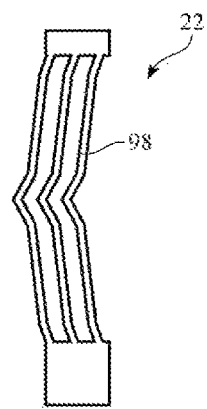
FIGS. 7, 8, 9, 10, 11, and 12 are illustrative liquid crystal display pixel electrode patterns that may be used in a display in accordance with an embodiment.
Figure 8:
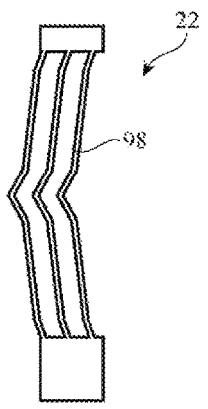
Figure 9:
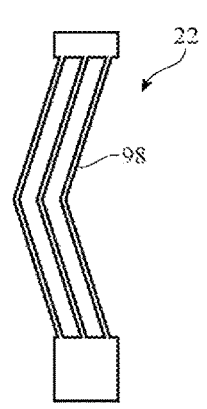
Figure 10:
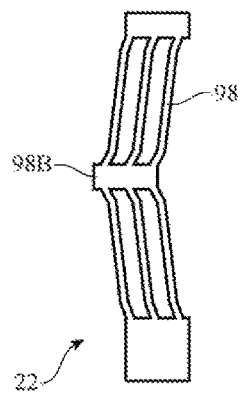
Figure 11:
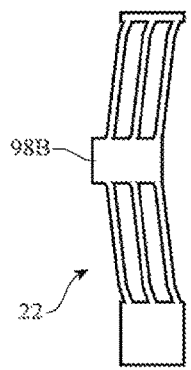
Figure 12:
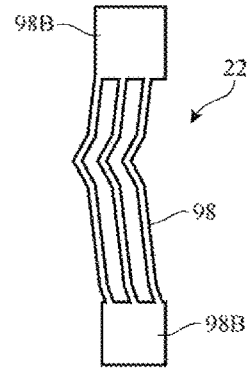

With another illustrative arrangement, the strengths of pixels 22A may be adjusted relative to each other and relative to the full-strength pixels by adjusting the electrode layouts for electrodes 98. This type of arrangement for adjusting pixel strength is illustrated in FIGS. 7, 8, 9, 10, 11, and 12 in which illustrative patterns for electrodes 98 are shown. Varying the size and shapes of electrodes 98 adjusts the strengths and orientations of electric fields E in liquid crystal layer 94 and therefore adjusts pixel strength (maximum amount of light 112 that is transmitted through a given pixel). As illustrated in the examples of FIGS. 7 and 8, pixel strength may be varied by varying the width along dimension X of each of the elongated fingers of electrodes 98. The fingers of electrodes 98 are wider in the example of FIG. 7 than in FIG. 8. FIG. 9 shows how the shape of electrodes 98 may be varied by arranging the fingers of electrodes 98 to have a V-shape. FIGS. 10 and 11 show how a rectangular portion 98B may be inserted in the middle of fingers 98 (e.g., rectangular electrode portion 98B may overlap the parallel electrode fingers of pixel 22). The overlapping rectangular electrode portion may be smaller (FIG. 10) or larger (FIG. 11) to adjust the strength of pixel 22. FIG. 12 shows how rectangular portions 98B may be formed at opposing ends of the fingers that make up electrodes 98 (e.g., rectangular electrode portions 98B may overlap the parallel fingers of electrodes 98). Other shapes and sizes may be used for electrodes 98 and these various electrode layouts may be used in combination with any suitable sizes and shapes for color filter elements 90 (FIG. 6) to vary the strength of antialiasing pixels 22A of display 14 relative to the full-strength pixels.

Figure 13:
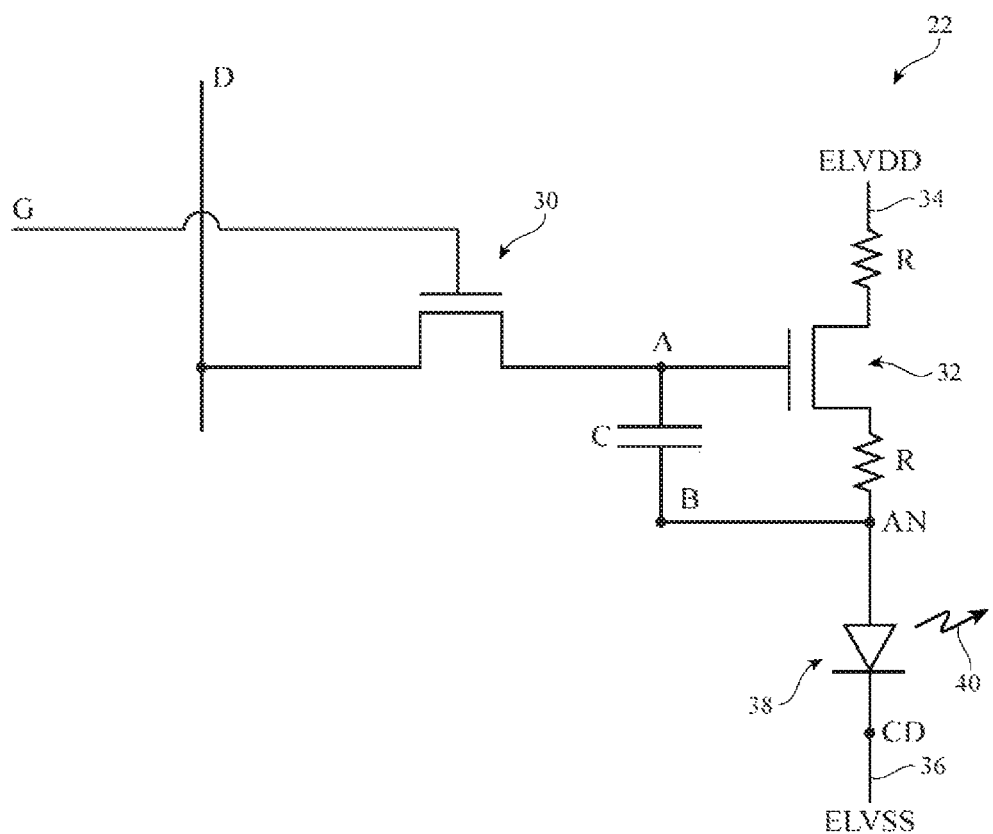
FIG. 13 is a pixel circuit in an illustrative organic light-emitting diode display in accordance with an embodiment.

In another illustrative configuration for device 10, display 14 may be an organic light-emitting diode display. An illustrative pixel circuit for a pixel 22 in an organic light-emitting diode display is shown in FIG. 13. In general, any suitable pixel circuit may be used (e.g., pixel circuits having any suitable number of control transistors, capacitors, etc.). The illustrative pixel circuit of FIG. 13 is presented as an example.

As shown in the circuit diagram of FIG. 13, each pixel 22 may have a light-emitting diode 38 that emits light 40 under the control of associated thin-film transistor circuitry. An array of pixels 22 may be formed from rows and columns of pixel structures (e.g., pixels formed from thin-film circuitry on display layers such as substrate 24 of FIG. 2). There may be any suitable number of rows and columns in the array of pixels 22 (e.g., ten or more, one hundred or more, or one thousand or more). Display 14 may include pixels 22 of different colors. As an example, display 14 may include red pixels that emit red light, green pixels that emit green light, and blue pixels that emit blue light. Configurations for display 14 that include pixels of other colors may be used, if desired. The use of a pixel arrangement with red, green, and blue pixels is merely illustrative.

As shown in the example of FIG. 13, pixel 22 may include light-emitting diode 38 and an associated drive transistor 32. A positive power supply voltage ELVDD may be supplied to positive power supply terminal 34 and a ground power supply voltage ELVSS may be supplied to ground power supply terminal 36. Diode 38 and transistor 32 may be coupled in series between the positive and ground terminals. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 32 is held in a desired state between successive frames of data, display pixel 22 may include a storage capacitor such as storage capacitor C. A first terminal of storage capacitor C may be coupled to the gate of transistor 32 at node A and a second terminal of storage capacitor C may be coupled to anode AN of diode 38 at node B. The voltage on storage capacitor C is applied to the gate of transistor 32 at node A to control transistor 32. Data can be loaded into storage capacitor C using one or more switching transistors such as switching transistor 30. When switching transistor 30 is off, data line D is isolated from storage capacitor C and the gate voltage on node A is equal to the data value stored in storage capacitor C (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor C. The new signal on capacitor C is applied to the gate of transistor 32 at node A, thereby adjusting the state of transistor 32 and adjusting the corresponding amount of light 40 that is emitted by light-emitting diode 38.

If desired, the circuitry for controlling the operation of light-emitting diodes for pixels 22 in display 14 (e.g., transistors, capacitors, etc. in display pixel circuits such as the display pixel circuit of FIG. 13) may be formed using configurations other than the configuration of FIG. 2 (e.g., configurations that include circuitry for compensating for threshold voltage variations in drive transistor 32, configurations in which an emission enable transistor is coupled in series with drive transistor 32, configurations with multiple switching transistors controlled by multiple respective scan lines, configurations with multiple capacitors, etc.). The thin-film transistors in pixels 22 may be silicon thin-film transistors (e.g., transistors having polysilicon active areas), may be semiconducting-oxide thin-film transistors (e.g., indium gallium zinc oxide transistors), may be n-channel metal oxide-semiconductor transistors, may be p-channel metal-oxide-semiconductor transistors, and/or may include other thin-film circuitry. The circuitry of pixel 22 of FIG. 13 is merely illustrative.

With one illustrative arrangement for adjusting the strengths of organic light-emitting diode pixels in display 14, the aperture ratio (the ratio of light-emitting area to non-light-emitting area) of the pixels can be selectively varied. With another illustrative arrangement, non-light-emitting loads may be coupled in series with drive transistor 32 to reduce the amount of emitted light for a given current and/or transistor strength may be decreased to reduce drive current and emitted light.

Figure 14:
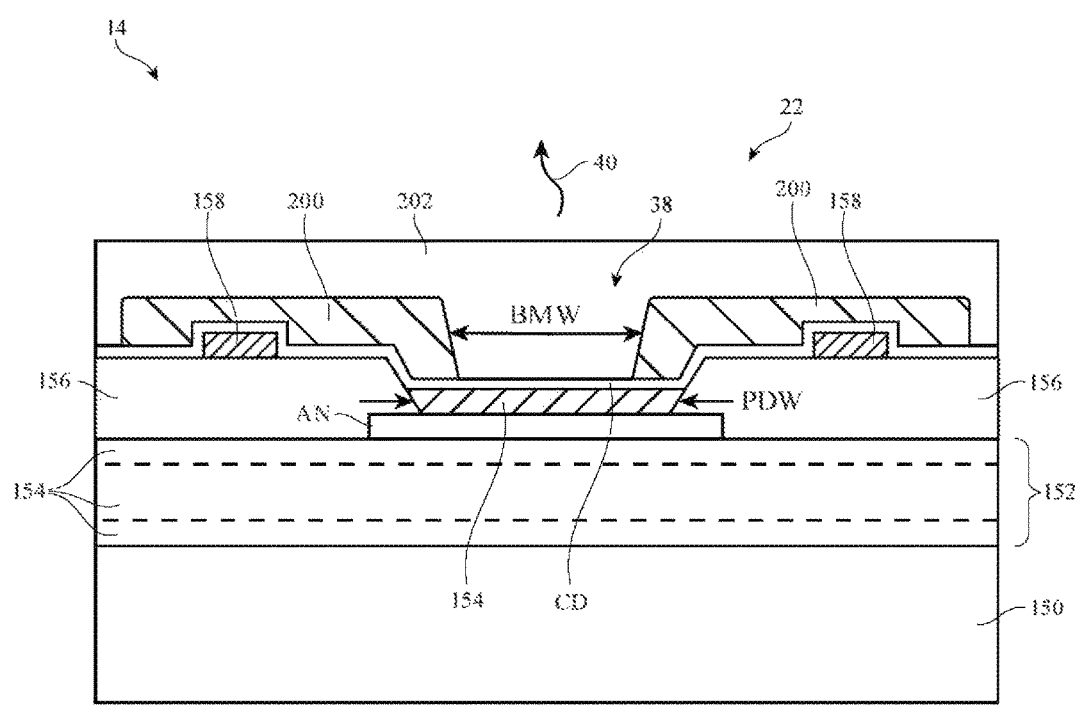
FIG. 14 is a cross-sectional side view of an illustrative organic light-emitting diode pixel in accordance with an embodiment.

FIG. 14 is a cross-sectional side view of an illustrative organic light-emitting diode pixel. Pixel 22 of FIG. 14 is formed on substrate 150 (e.g., a dielectric layer, etc.). Thin-film circuitry such as thin-film layer 152 may contain thin-film layers 154 (e.g., dielectric layers, semiconductor layers, and metal layers) that form transistors, capacitors, and other circuitry for pixel 22. Anode AN may be formed on layers 152. Pixel definition layer 156 may have an opening of lateral dimensions such as lateral dimension PDW. Emissive material 154 may be formed in this opening. During fabrication, emissive material 154 may be deposited through a shadow mask (sometimes referred to as a fine metal mask). Spacers (mask spacers) 158 may be used to prevent contact between the shadow mask and the surface of pixel definition layer 156 and cathode CD. Cathode layer CD may be formed from a blanket layer (e.g., an optically transparent thin metal layer) that covers display 14. During operation, current may pass from anode AN to cathode CD through emissive material 154, thereby causing emissive material 154 to emit light 40 from diode 38. Display 14 may include a layer of encapsulant such as encapsulant 202 that covers diodes 38 in pixels 22.

To selectively reduce the strength of antialiasing pixels in display 14 relative to full-strength pixels, opaque masking layer 200 (e.g., a layer of black masking material such as a layer of black photoresist) may be patterned on display 14. In particular, opaque masking layer 200 may be patterned to form an opaque masking layer opening in each pixel that is aligned with diode 38. Light 40 may be emitted through this opening. In full-strength pixels, the lateral dimensions of the opaque masking layer opening (see, e.g., dimension BMW of FIG. 14) are larger than the lateral dimensions of emissive layer 154 in the pixel definition layer opening, so all of light 40 is emitted. In antialiasing pixels, the lateral dimensions of the opening in layer 200 are reduced (as shown in FIG. 14), so that some of light 40 is blocked and the strength of the pixels is reduced relative to that of the full-strength pixels.

To reduce the aperture ratio of pixel 22 of FIG. 14, for example, the size of the opening in pixel definition layer 156 associated with emissive material 154 (e.g., dimension PDW) may be reduced (e.g., in scenarios in which pixel definition layer 156 is formed from black photoresist or other opaque masking layer) and/or the size of the opening in opaque masking layer 200 (e.g., dimension BMW) that overlaps anode AN and emissive material 154 may be reduced. If desired, the size of the active area of diode 38 may also be selectively adjusted by reducing the area of anode AN and/or by reducing the area of emissive material 154, etc.

Figure 15:
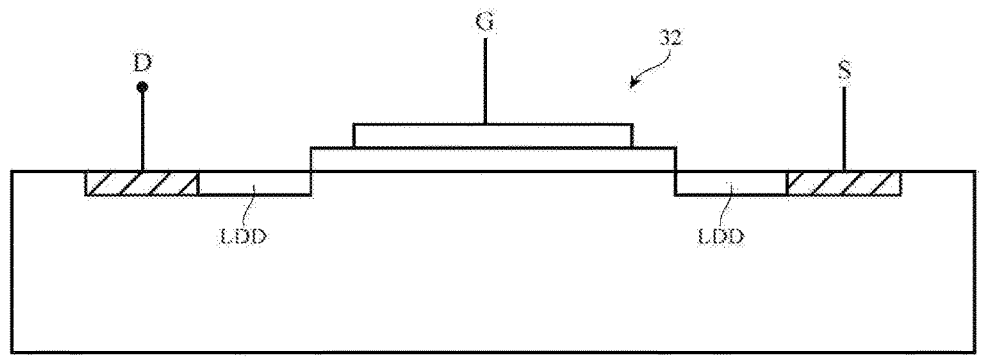
FIG. 15 is a cross-sectional side view of an illustrative transistor for an organic light-emitting diode display pixel in accordance with an embodiment.
Figure 16:
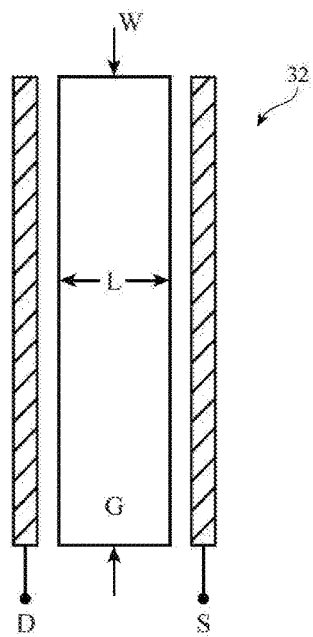
FIG. 16 is a top view of an illustrative transistor for an organic light-emitting diode display pixel in accordance with an embodiment.

If desired, non-light-emitting loads such as resistances R of FIG. 13 may be placed in series with light-emitting diode 38. Series resistances (resistors) R may be formed from lightly doped drain (LDD) regions in the source-drain terminals of transistor 32, as shown in FIG. 15. Regions LDD may have higher resistance than adjacent more heavily doped regions of the source-drain terminals of transistor 32 and may therefore exhibit enhanced resistance. The doping of regions LDD may be reduced and/or the lateral dimension of regions LDD may be increased to increase the value of load resistances R, thereby weakening transistor 32. If desired, transistor 32 may also be weakened by reducing the width W of transistor 32 (the channel of transistor 32) relative to its length L, as shown in FIG. 16.

The foregoing is merely illustrative and various modifications can be made to the described embodiments. The foregoing embodiments may be implemented individually or in any combination.

What is claimed is:

1. An electronic device, comprising:
   a housing;
   a display in the housing, wherein the display has at least two curved edges and a straight peripheral edge that extends between the two curved edges; and
   an array of pixels in the display including a first group of pixels and a second group of pixels, wherein the pixels of the second group of pixels are of reduced strength relative to the pixels of the first group of pixels, wherein the pixels of the second group of pixels extend along the two curved edges and have a pattern of strengths that visually smooth content that is displayed on the array of pixels along the two curved edges, wherein the pixels of the first group of pixels have first electrodes, wherein each one of the first electrodes has a plurality of first electrode fingers, wherein each one of the first electrode fingers has a first width, wherein the pixels of the second group of pixels have second electrodes, wherein each one of the second electrodes has a plurality of second electrode fingers, and wherein each one of the second electrode fingers has a second width that is different than the first width.

2. The electronic device defined in claim 1 wherein the second group of pixels includes pixels of at least first, second, and third different strengths that are weaker than the pixels of the first group of pixels.

3. The electronic device defined in claim 1 wherein the housing has at least one curved housing edge that runs along the curved edge of the display.

4. The electronic device defined in claim 1, wherein the first electrode fingers are first elongated parallel electrode fingers and wherein the second electrode fingers are second elongated parallel electrode fingers.

5. An electronic device, comprising:
   a housing;
   a display in the housing, wherein the display has at least one curved edge; and
   an array of liquid crystal display pixels in the display including a first group of pixels and a second group of pixels, wherein the pixels of the second group of pixels are of reduced strength relative to the pixels of the first group of pixels, wherein the pixels of the second group of pixels extend along the curved edge and have a pattern of strengths that visually smooth content that is displayed on the array of liquid crystal display pixels along the curved edge, wherein a first pixel of the second group of pixels has a first electrode, wherein the first electrode includes parallel fingers with a first overlapping rectangular portion that has a first size, wherein a second pixel of the second group of pixels has a second electrode, and wherein the second electrode includes parallel fingers with a second overlapping rectangular electrode portion that has a second size that is different than the first size.

6. The electronic device defined in claim 5 wherein the pixels of the first group of pixels have color filter elements with respective first areas and wherein the pixels of the second group of pixels have color filter elements with respective second areas each of which is smaller than each of the first areas.

7. An electronic device, comprising:
   a housing having at least two corners;
   a display in the housing, wherein the display has at least two curved edges running along the two corners; and
   an array of liquid crystal display pixels in the display including first pixels and second pixels that are of reduced strength relative to the first pixels, wherein the second pixels extend in a band along each curved edge and have a pattern of strengths configured to visually smooth content that is displayed on the array of liquid crystal display pixels along that curved edge, wherein a first pixel of the second pixels and a second pixel of the second pixels each have a respective electrode that includes elongated fingers and a rectangular electrode portion, and wherein a first size of the rectangular electrode portion of the first pixel is different than a second size of the rectangular electrode portion of the second pixel.

8. The electronic device defined in claim 7, wherein the rectangular electrode portion of the first pixel is interposed in the middle of the elongated fingers of the first pixel and wherein the rectangular electrode portion of the second pixel is interposed in the middle of the elongated fingers of the second pixel.

9. The electronic device defined in claim 7, wherein the elongated fingers of the first pixel extend from first and second opposing sides of the rectangular electrode portion of the first pixel and wherein the elongated fingers of the second pixel extend from first and second opposing sides of the rectangular electrode portion of the second pixel.

* * * * *